(12) United States Patent
Seubert

(10) Patent No.: US 6,603,327 B2
(45) Date of Patent: Aug. 5, 2003

(54) TEST MODULE

(75) Inventor: Bernhard Seubert, Limburg (DE)

(73) Assignee: Siemens VDO AG, Frankfurt (DE)

( * ) Notice: Subject to any disclaimer, the term of this patent is extended or adjusted under 35 U.S.C. 154(b) by 0 days.

(21) Appl. No.: 09/925,561

(22) Filed: Aug. 8, 2001

(65) Prior Publication Data

US 2002/0073253 A1 Jun. 13, 2002

(30) Foreign Application Priority Data

Aug. 11, 2000 (DE) .......................... 100 40 050

(51) Int. Cl.[7] .................. G01R 31/26; G01R 31/02
(52) U.S. Cl. ........................ 324/765; 324/763
(58) Field of Search .............. 324/765, 763, 324/537, 73 R; 716/3–6, 18, 54; 364/490, 578; 395/183.06, 183.08, 183.13

(56) References Cited

U.S. PATENT DOCUMENTS 4,745,355 A * 5/1988 Eichelberger et al. .... 324/73 R

FOREIGN PATENT DOCUMENTS

| DE | 44 15 143 A1 | 2/1995 |
| DE | 44 39 840 C1 | 6/1996 |
| DE | 196 21 875 A1 | 4/1997 |
| DE | 197 40 543 C1 | 7/1999 |

* cited by examiner

*Primary Examiner*—N. Le
*Assistant Examiner*—Amy He
(74) *Attorney, Agent, or Firm*—Mayer, Brown, Rowe & Maw

(57) ABSTRACT

Disclosed is a test module (1) for comparative testing of an electronic component (2) and a simulation module (3) that simulates the function of the electronic component (2) essentially in the form of a software program. The test module (1) has an input/output interface to an external module (4) interacting with the electronic component (2) to be tested and also to the electronic component (2) and the simulation module (3). Equivalent input interfaces of the electronic component (2) and of the simulation module (3) are connected to one another by the test module (1). In addition, the test module (1) has a comparator (6) for comparing output signals from the electronic component (2) and from the simulation module (3) and has a memory log (7) linked to the comparator (6). The inventive test module (1) permits a rapid comparative test of the functions of the electronic component (2) and of the simulation module (3).

16 Claims, 1 Drawing Sheet

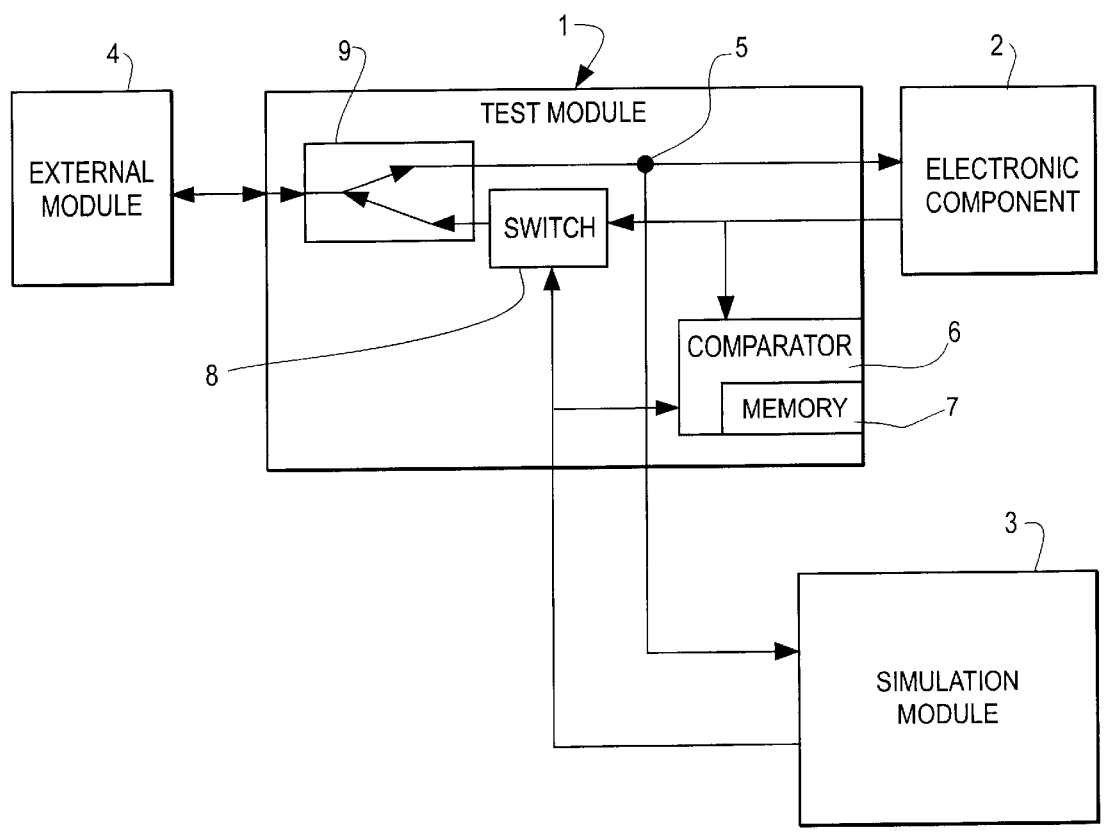

TEST MODULE

BACKGROUND

1. Field of the Invention

The invention relates to a test module for comparative testing of an electronic component, a simulation module that simulates the functions of the electronic component, and a method for comparative testing of such an electronic component and of such a simulation module.

2. Description of Related Art

The design of electronic components is often computer-assisted. In this context, an entire circuit is designed and tested on the computer. The computer simulation module designed in the process simulates the functions of the real electronic component essentially in the form of a program. In addition, the simulation module can use input and output interfaces to interact with one or more external modules which are also provided for interplay with the real electronic component. In this context, appropriate signals (in particular, digital signals) are interchanged between the simulation module and an external module.

Only after the electronically designed circuit has responded satisfactorily is the real electronic component produced in the form of an electronic circuit. The electronic circuit and its interplay with the external module is then tested. In this context, discrepancies may arise in the interplay between the external module and the real electronic component and between the external module and the simulation module. These discrepancies can be caused, for example, by discrepancies between the real structural elements of the electronic component and the simplified computer models in the simulation module. The discrepancies may also be attributable to faults in the electronic component. For these reasons, the timing response and the signal contents of the interplay between the external module and the electronic component and between the external module and the simulation module are checked. Logs are produced and manually controlled both for the connection between the external module and the electronic component and for the connection between the external module and the simulation module. This procedure is complex, however, and may additionally result in discrepancies remaining undiscovered.

It is therefore an object of the invention to specify a test module that can be used to achieve simplified comparative testing of the electronic component and of the simulation module. Another object of the invention is to specify an automated method for comparative testing of the electronic component and of the associated simulation model.

SUMMARY

The purpose and advantages of the invention will be set forth in, and apparent from, the description and drawings that follow, as well as will be learned through practice of the invention. Additional advantages of the invention will be realized and attained by the elements of the apparatus and methods of using the invention described herein.

The invention relates to a test module for comparative testing of an electronic component provided with at least one input and output interface, and of a simulation module that simulates the functions of the electronic component essentially in the form of a program and likewise has at least one input and output interface. The invention also relates to a method for comparative testing of such an electronic component and of such a simulation module.

In accordance with one aspect of the present invention, a test module for comparative testing of an electronic component is provided with at least one input and output interface. Further, a simulation module is provided that simulates the functions of the electronic components essentially in the form of a program and likewise has at least one input and output interface. The test module has an input/output interface to an external module interacting with the electronic component to be tested and also to the electronic component and the simulation module. Equivalent input interfaces of the electronic component and of the simulation module are connected to one another by the test module. Also, the test module has a comparator for comparing output signals from the electronic component and from the simulation module and has a memory log connected to the comparator.

The test module supplies both the electronic component and the simulation module with the same signals, transmitted from the external module, for example via a bus. Both the electronic component and the simulation module then generate the appropriate response signals, which are supplied to a comparator and are automatically compared. The comparator is connected to a memory log that stores the results of this comparison. In one preferred alternate embodiment of the invention, only those results are stored for which the comparator has detected a difference between the output signals from the electronic components and the output signals from the simulation module. In this embodiment, the memory log stores a fault log which is relatively simple to evaluate.

In the preferred embodiment, the electronic component is a digital electronic circuit which receives digital input signals and generates digital output signals. One specific use of the invention is for the testing of electronic components for motor vehicles, for example, audio and navigation systems components that communicate via a bus customary in motor vehicle applications.

In a preferred alternate embodiment, the test module contains a selection switch that permits output signals from the electronic component and/or from the simulation module to be forwarded to the external module. This allows different scenarios to be produced and tested. By way of example, a first position of the selection switch connects the output signal from the electronic component directly to the external module while the simulation module runs concurrently for control purposes. The differences in the output signals from the electronic component and from the simulation module are recorded in the memory log.

In a second position of the selection switch, the output signals from the simulation module are connected directly to the external module, and the electronic component runs concurrently for control purposes. The differences in the output signals from the simulation module and from the electronic component are recorded in the memory log. By contrast with the first variant, in this case, the reactions of the external component are conditioned by the output signal from the simulation module.

In a third position of the selection switch, both the electronic component and the simulation module are connected to the external module, but the output signals from the simulation module are forwarded to the external module only if the response messages from functions in the electronic component are not correctly implemented.

Thus, in accordance with the present invention, the comparative testing of an electronic component provided with at least one input and output interface and of a simulation module which simulates the functions of the electronic component essentially in the form of a program and likewise has at least one input and output interface, equivalent input interfaces of the electronic component and of the simulation module are connected to one another for receiving signals from an external module interacting with the electronic component to be tested. Output signals from the electronic component and from the simulation module are automatically compared with one another and are stored in a memory log if there are discrepancies.

These and other features and advantages of the invention will be apparent upon consideration of the following detailed description of the presently preferred embodiments of the invention, taken in conjunction with the claims and appended drawings, as well as will be learned through the practice of the invention.

BRIEF DESCRIPTION OF THE DRAWING

The FIGURE shows a test module having an electronic component connected thereto, a simulation module and an external module in accordance with preferred embodiment of the present invention.

DESCRIPTION OF THE PREFERRED EMBODIMENTS

While the invention can be embodied in many different forms, there is shown in the drawing, and will herein be described in detail, preferred embodiments of the present invention with the understanding that the present disclosure is to be considered as an exemplification of the principles of the invention and is not intended to limit the invention to the embodiments illustrated.

"Referring now to the FIGURE, a test module 1 is connected by interfaces (not shown in more detail) to an electronic component 2 to be tested, and to a simulation module 3 and an external module 4. The simulation module is in the form of a software program that runs on a computer having the necessary input/output interface. Signals are interchanged between the electronic component 2 and the external module 4 and between the test module 1 and the external module 4. Equivalent input interfaces of the electronic component 2 and of the simulation module 3 are supplied with the same input signals, and, in accordance with the preferred embodiment, this is accomplished through node 5. The output signals generated based on the input signals for the electronic component 2 and for the simulation module 3 are supplied to a comparator 6. The comparator 6 compares these two output signals with one another and, if there are discrepancies, an appropriate entry is made in a memory log 7. The content of the memory log 7 can be read or printed using an interface (not shown). The test module 1 also contains a selection switch 8 that is linked both to the output interface of the electronic component 2 and to that of the simulation module 3. The selection switch 8 can be used to connect the output signals from the electronic component 2 and/or from the simulation module 3 to the external module 4."

In a first operating mode of the test module 1, the selection switch 8 is used to forward the output signals from the electronic component 2 to the external module. With this position of the selection switch 8, the interplay between the electronic component 2 and the external module 4 is tested directly, with output signals also being generated by the simulation module 3 as comparison values and being supplied to the comparator 6 and compared with the output signals from the electronic module 2.

In a second operating mode of the test module 1, the selection switch 8 is used to supply the output signals from the simulation module to the external module 4. With this position of the selection switch 8, there is interplay between the external module 4 and the simulation module 3, while the electronic component 2 runs concurrently as comparison unit. The output signals from the electronic component 2 are supplied to the comparator 6 and are compared with the output signals from the simulation module 3. This operating mode is particularly suitable when the interplay between the simulation module 3 and the external module 4 is satisfactory whereas the electronic component to be tested is still increasingly generating fault signals. In this operating mode, different operating states can be run through relatively quickly, and the faults in the electronic component which arise in the process can be recorded.

In a third operating mode of the test module 1, the external module 4 is supplied with both output signals from the electronic component 2 and from the simulation module 3. In this operating mode, it is possible to test functions that have not yet been implemented in the electronic component 2, so that the electronic component 2 does not generate a corresponding output signal.

In the preferred embodiment shown, the test module 1 has, as a further component, a splitter 9 in the reception and transmission path, which splitter is used for signal splitting.

It is to be understood that a wide range of changes and modifications to the embodiments described above will be apparent to those skilled in the art, and these changes and modifications are contemplated herein. For example, specific refinements of individual function groups of the test module, such as of the comparator 6, the selection switch 7 or the splitter 9, are known to the person skilled in the art and may be provided in a wide variety of ways. It is, therefore, intended that the foregoing detailed description be regarded as illustrative rather than limiting, and that it be understood that it is the following claims, including all equivalents, that are intended to define the spirit and scope of the invention.

I claim:

1. Test module for comparative testing of an electronic component provided with at least one input and output interface and of a simulation module which simulates the functions of the electronic component essentially in the form of a program and likewise has at least one input and output interface, where the test module has an input/output interface to an external module interacting with the electronic component to be tested, the electronic component and the simulation module, equivalent input interfaces of the electronic component and of the simulation module are connected to one another by the test module, and also the test module has a comparator for comparing output signals from the electronic component and from the simulation module and has a memory log linked to the comparator storing the results of the comparison; and wherein the external module sends input signals to the electronic component based on previous output signals from the electronic component.

2. Test module according to claim 1, characterized in that the test module has a splitter for splitting a signal received from the external module into an input signal sent to the input interfaces of the electronic component and of the simulation module, and an output signal.

3. Test module according to claim 1, characterized in that the test module contains a selection switch which permits output signals from the electronic component and from the simulation module to be forwarded to the external module.

4. Method for comparative testing of an electronic component provided with at least one input and output interface and of a simulation module which simulates the functions of the electronic component essentially in the form of a program and likewise has at least one input and output interface, where equivalent input interfaces of the electronic component and of the simulation module are connected to one another for receiving signals from an external module interacting with the electronic component to be tested by sending input signals to the electronic component based on previously received output signals from the electronic component, and output signals from the electronic component and from the simulation module are automatically compared with one another and are stored in a memory log if there are discrepancies.

5. Method according to claim 4, characterized in that output signals from the electronic component are forwarded to the external module.

6. Method according to claim 4, characterized in that output signals from the simulation module are forwarded to the external module.

7. Method according to claim 4, characterized in that both output signals from the electronic component and output signals from the simulation module are forwarded to the external module.

8. Method according to claim 7, characterized in that output signals from the simulation module are forwarded to the external module only if a corresponding output signal from the electronic component is not available.

9. A test module for comparative testing of an electronic component comprising:
   at least one test input and output interface coupled with the electronic component;
   a simulation module that simulates the functions of the electronic component, said simulation module is coupled to the test input and output interface, and wherein the electronic component and the simulation module are functionally coupled to one another through the test module;
   an external module coupled to the test input and output interface;
   a comparator for comparing output signals from the electronic component and from the simulation module; and
   a memory log coupled to the comparator, the memory log storing the results of the comparisons from the comparator and wherein the external module sends input signals to the electronic component based on previous output signals from the electronic component.

10. A test module as claimed in claim 9, wherein the test module further comprises a splitter for splitting a signal received from the external module into an input signal sent to the electronic component and the simulation module and an output signal.

11. Test module according to claim 9, wherein the test module further includes a selection switch that permits output signals from the electronic component and from the simulation module to be coupled to the external module.

12. A method for testing an electronic component comprising:
   providing a simulation module that simulates the functions of the electronic component using a software program;
   coupling equivalent input interfaces of the electronic component and of the simulation module with one another;
   providing signals to the electronic component and to the simulation module from an external module interacting with the electronic component by sending input signals to the electronic component based on previously received output signals from the electronic component;
   comparing output signals from the electronic component and from the simulation module; and
   storing the comparison results in a memory log.

13. A method for testing an electronic component as claimed in claim 12, wherein output signals from the electronic component are provided to the external module.

14. A method for testing an electronic component as claimed in claim 12, wherein output signals from the simulation module are provided to the external module.

15. A method for testing an electronic component as claimed in claim 12, wherein output signals from the electronic component and output signals from the simulation module are provided to the external module.

16. A method for testing an electronic component as claimed in claim 15, wherein output signals from the simulation module are provided to the external module only if a corresponding output signal from the electronic component is not available.

* * * * *